United States Patent [19]

Schierjott

[11] 4,320,307
[45] Mar. 16, 1982

[54] ARRANGEMENT FOR INTERFERENCE SUPPRESSION OF ELECTROMAGNETIC CIRCUITS

[75] Inventor: Rudolf Schierjott, Germering, Fed. Rep. of Germany

[73] Assignee: Siemens Aktiengesellschaft, Berlin & Munich, Fed. Rep. of Germany

[21] Appl. No.: 177,626

[22] Filed: Aug. 13, 1980

[30] Foreign Application Priority Data

Sep. 17, 1979 [DE] Fed. Rep. of Germany ....... 2937539

[51] Int. Cl.³ .............................................. H05K 9/00
[52] U.S. Cl. ...................................... 307/91; 361/424
[58] Field of Search ........................... 307/91; 361/424

[56] References Cited

FOREIGN PATENT DOCUMENTS 2446624 7/1976 Fed. Rep. of Germany .

Primary Examiner—Michael L. Gellner
Attorney, Agent, or Firm—Hill, Van Santen, Steadman, Chiara & Simpson

[57] ABSTRACT

The invention relates to an arrangement for interference suppression in electronic circuits. A system is disclosed for electromagnetically shielding electronic devices without mains separation at the input side and which generate high-frequency noise voltages, particularly converter circuits with shielded inputs and outputs electrically separated by transformers and which use filter circuits arranged at the input and output sides. A large-surface printed circuit having surface-wide electrodes on both surfaces is provided between the shielded circuit portion at the mains side and the shielded circuit portion at the output side of the circuit to be shielded. The one electrode of the printed circuit is connected to the shield at the mains side and its other electrode is connected to the device ground allocated to the shield at the output side.

5 Claims, 2 Drawing Figures

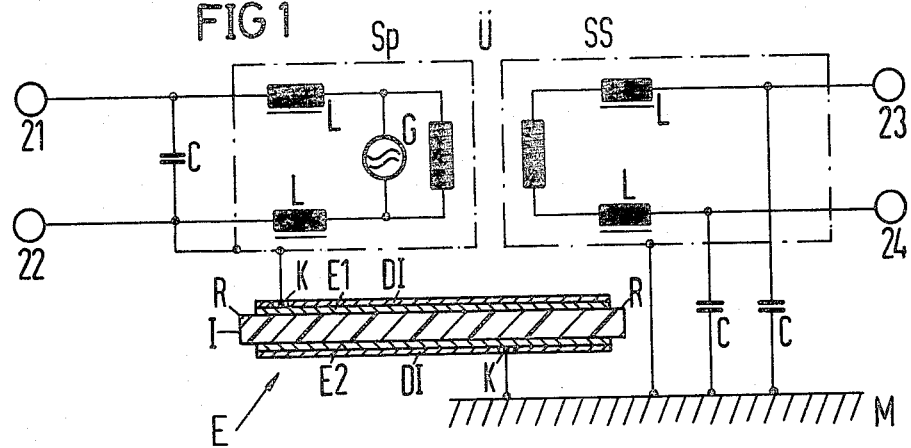
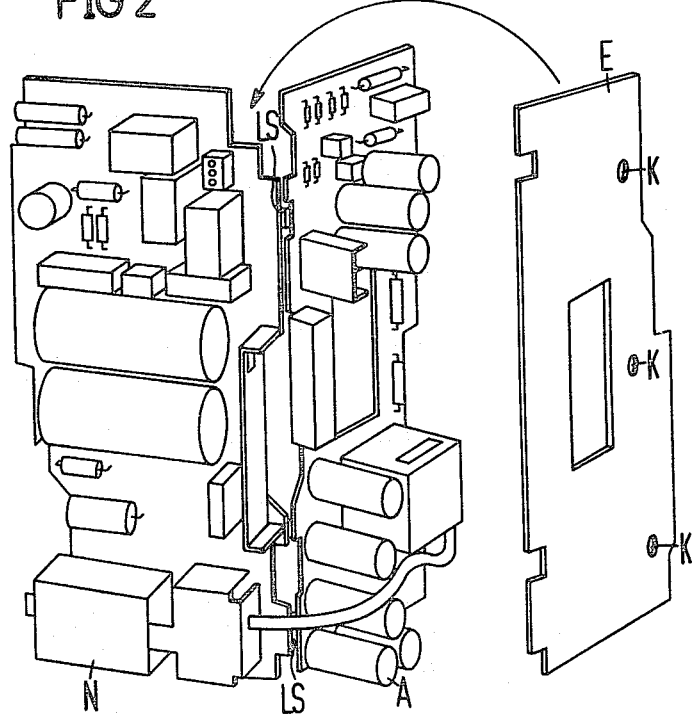

ARRANGEMENT FOR INTERFERENCE SUPPRESSION OF ELECTROMAGNETIC CIRCUITS

BACKGROUND OF THE INVENTION

The invention relates to an arrangement for interference suppression of electronic devices generating high-frequency noise voltages without mains disconnection at the input side, such as converter circuits. A shielded input and output electrically separated by means of transformers is employed together with filter circuits arranged at the input and output side.

Electronic circuits with semiconductors functioning as switches often represent high frequency sources of interference with an extensive frequency spectrum. In order to avoid radio interferences, the high frequency voltages on the input and output lines of such devices must be suppressed by means of special techniques.

The radio or electromagnetic shielding of mains-fed electronic devices of the type initially cited can present great difficulties when, upon observance of special regulations for the protective insulation of the devices, their reference potential dare not be connected to a grounded conductor. The techniques for sufficient electromagnetic shielding are made even more difficult in that electronic circuits are operated by the mains without electrical separation. The employment of filter circuits with large capacitances in the circuit of the mains lines cannot guarantee a sufficient suppression of the radio interference voltage, since high frequency noise voltages are unavoidably asymmetrically relayed by mains lines via winding capacitances of the transformer and other circuit capacitances.

In addition to these techniques, it is known from German AS 2,446,624, incorporated herein by reference, to completely shield the portion of the circuit which lies at the mains input side and at the output side. Such a shielding, however, has the disadvantage that, given high frequencies, the shield exhibit inductive reactances which are too high and, thus prevent a discharge of the high-frequency currents.

SUMMARY OF THE INVENTION

An object of the invention is to reduce to small values high frequency noise voltages generated by circuits of the type initially cited and which extend into the megahertz range.

Given a circuit of the type initially cited, this object is inventively achieved in that a large-surface printed circuit provided with surface-wide electrodes on both surfaces is arranged between a shielded portion of the circuit at the mains side and the shielded circuit portion at the output side of the circuit, the one electrode of this printed circuit being connected to the shield on the mains side and its other electrode being connected to the ground allocated to the shield at the output side.

In an advantageous embodiment of the arrangement, the circuit portion at the mains side and the circuit portion at the output side are respectively arranged on two separate printed circuits between which the large-surface printed circuit designed as a double-laminate is arranged.

By means of the arrangement of the inventive double-laminated printed circuit between the circuit portions at the input side and at the output side, a sufficient electromagnetic shielding in the high-frequency range is achieved despite the required elimination of the capacitors connecting those parts of the circuit arrangement carrying mains voltage to ground. At the same time, such a printed circuit can also fulfill additional shielding purposes between the two circuit portions. Moreover, it serves for spacing in an assembly which is spatially limited.

The leakage distances and air gaps required in accord with safety regulations can be achieved in a simple manner by means of etching the board edges of the printed circuit free of conductive material.

BRIEF DESCRIPTION OF THE DRAWINGS

FIG. 1 is a schematic illustration of an equivalent circuit of an electromagnetically shielded switching current supply utilizing the printed circuit technique of the invention; and FIG. 2 is a schematic illustration of an embodiment of the printed circuit as employed at a portion of a circuit to be shielded.

DESCRIPTION OF THE PREFERRED EMBODIMENTS

FIG. 1 illustrates a circuit with a high frequency noise generator G to be radio shielded, the portion on the mains side of said circuit with the input 21, 22 being electrically separated by means of a transformer Ü from the output 23, 24. A respective LC filter circuit is inserted between the noise generator G and the input terminals as well as between the secondary winding of the transformer Ü and the output terminals.

It is presumed that the circuit portion with the primary winding of the transformer on the mains side dare not be connected to the grounded conductor of the circuit. Therefore this portion of the circuit at the output side is connected to a reference potential M. The portions of the circuit at the mains side and at the output side emitting high-frequency noise voltages are surrounded by shields SP and SS. Thus, noise voltages which can become effective in the network circuit are of necessity impressed on the shields. Given high noise frequencies, however, such shields exhibit high inductive reactances which prevent a discharge of the interferences. This, however, is accomplished by means of the inventive radio or electromagnetic shielding plate E. The electromagnetic shielding plate E consists of a double-laminated printed circuit consisting of a supporting insulation layer I on which large-surface, insulated electrodes E1 and E2 are arranged on both sides. Accordingly the electrode E1 is connected to the primary shield SP and the electrode E2 is connected to the device ground M and thus to the secondary shield SS. The cover insulation layers DI of the printed circuit E are interrupted at the contact locations K. In order to generate the leakage paths and air gaps required in accordance with safety regulations, the electrodes E1 and E2 are etched away at the edges R of the printed circuit E.

In the embodiment of the circuit part illustrated in FIG. 2, the mains side N and the output side A circuit portions are arranged on two separate printed circuits. These printed circuits N and A are connected to one another via insulating brackets LS and can be rotated away from one another. The appropriately designed printed circuit E is inserted between the two printed circuits N and A; for reasons of clarity, the primary shield SP at the input side and the secondary shield SS at the output side are not illustrated.

In such an arrangement, the printed circuit not only attenuates the high-frequency interferences, but rather it fulfills additional shielding functions. In addition, it also serves as a spacer in order to prevent contact between the components when the printed circuits N and A are built in.

List of Reference Symbols

G—source of interference
Ü—transformer of the circuit portion
DI—cover insulation layers
C—interference suppression capacitors
L—interference suppression chokes
SP—primary shield
SS—secondary shield
M—device ground (for example, housing)
E—interference suppression plate
R—etching edge
E1, E2—electrodes
I—insulator
21. 22—input
23, 24—output
K—contact location
N—input side of the circuit portion
A—output side of the circuit portion
LS—bracket
V—recess Although various minor modifications may be suggested by those versed in the art, it should be understood that I wish to embody within the scope of the patent warranted hereon, all such embodiments as reasonably and properly come within the scope of my contribution to the art.

I claim as my invention:

1. An arrangement for reducing electromagnetic interference in an electronic circuit which does not have mains separation at an input side and which generates high-frequency noise voltages, comprising: said circuit having a shielded input portion at the input side and a shielded output portion at an output side electrically separated by means of a transformer and having a filter circuit arranged at the input side and output side; a large-surface printed circuit board having surface-wide electrodes substantially covering both surfaces arranged between the shielded circuit portion at the input side and the shielded circuit portion at the output side, the one electrode being connected to a shield at the input side and its other electrode being connected to a ground for the circuit portion allocated to the shield at the output side.

2. An arrangement according to claim 1 wherein the circuit portions at the input side and output side are arranged on two separate printed circuits between which the large-surface printed circuit board is positioned.

3. An arrangement according to claim 1 wherein edges of the printed circuit board are etched free of electrode material.

4. An arrangement for reducing electromagnetic interference in an electronic circuit, comprising: an electronic circuit having a ground which is electrically isolated from a mains circuit; said circuit having a shielded input portion and a shielded output portion connecting to the circuit ground which is electrically isolated from the shielded input portion; and an insulated circuit board having a metal layer substantially covering each major surface thereof and being arranged between the input portion and output portion, one of the metal layers being connected to a shield of the input portion and the other metal layer being connected to the circuit ground and shield of the output portion.

5. The arrangement of claim 4 wherein the input portion comprises a first printed circuit, the output portion comprises a second printed circuit, and the insulated board with the metal layers thereon has an insulating layer over each metal layer and is positioned between the input circuit board and output circuit board in sandwich fashion, the insulating layer on the metal layer preventing unwanted contact between portions of the input and output circuit boards and the metal layers.

* * * * *